United States Patent [19]
Du et al.

[11] Patent Number: 5,268,640
[45] Date of Patent: Dec. 7, 1993

[54] METHOD AND APPARATUS FOR THE FORMATION OF A PLURALITY OF NMR IMAGES, EACH HAVING A DIFFERENT CHARACTERISTIC, OF THE SAME SLICE, IN A SINGLE SEQUENCE

[75] Inventors: Leila N. Du, San Bruno; Hsu Chang, Fremont; George W. Mattinger, San Bruno, all of Calif.

[73] Assignee: Toshiba America MRI, Inc., San Francisco, Calif.

[21] Appl. No.: 863,554

[22] Filed: Apr. 2, 1992

[51] Int. Cl.$^5$ .............................................. G01V 3/00
[52] U.S. Cl. .................................................... 324/309
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,471,306 | 9/1984 | Edelstein et al. | 324/309 |
| 4,694,250 | 9/1987 | Iwaoka et al. | 324/309 |
| 4,709,212 | 11/1987 | MacFall et al. | 324/309 |
| 4,734,646 | 3/1988 | Shenoy et al. | 324/309 |
| 5,086,275 | 2/1992 | Roemer | 324/309 |
| 5,168,226 | 12/1992 | Hinks | 324/309 |

OTHER PUBLICATIONS

SMRM, 1989, "Intra-Acquisition Modification of Pulse Sequence Parameters", by F. Farzaneh, S. J. Riederer, R. L. Ehman, p. 855.
Radiology, Aug. 1991, "T2-Weighted Spin-Echo Pulse Sequence with Variable Repetition and Echo Times for Reduction of MR Image Acquisition Time", by R. Kim Butts, BS, Farhad Farzaneh, S. J. Riederer, J. N. Rydberg, R. C. Grimm.

*Primary Examiner*—Michael J. Tokar
*Attorney, Agent, or Firm*—Limbach & Limbach

[57] ABSTRACT

A single sequence for the formation of a plurality of images of the same selected nuclei but with each image having a different contrast characteristic is disclosed. MRI signals are acquired during the first time interval which comprises a plurality of first intervals with each of the first intervals being substantially the same. During the first time interval, the selected nuclei are phase encoded by a different magnetic phase encoding gradient. The sequence continues to acquire a second plurality of MRI signals from the same plurality of selected nuclei. The second time interval comprises a plurality of second intervals different from the first intervals. During the second interval, the selected nuclei are phase encoded by a different magnetic phase encoding gradient but with the magnetic phase encoding gradient being the same as or a subset of those during the first time interval. The data from the first and second plurality of MRI signals are regrouped and portions are re-used to form a plurality of regrouped data sets. Each of the regrouped data sets is then fourier transformed to produce a plurality of images of the selected nuclei. Each image is of the same plurality of selected nuclei but with different contrast characteristics.

34 Claims, 9 Drawing Sheets

Microfiche Appendix Included
(1 Microfiche, 34 Pages)

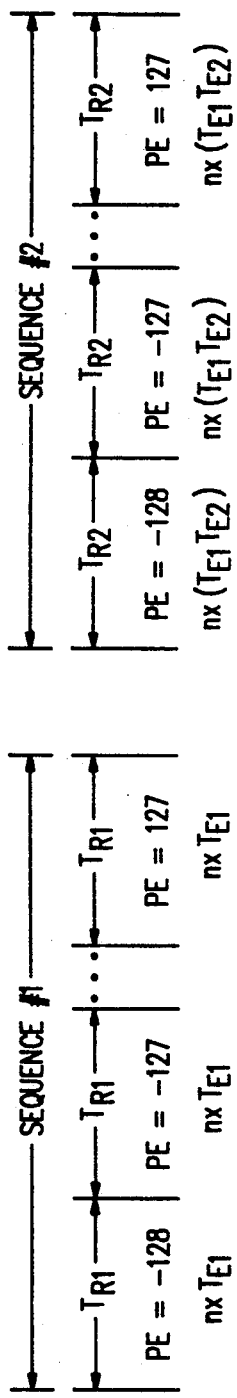
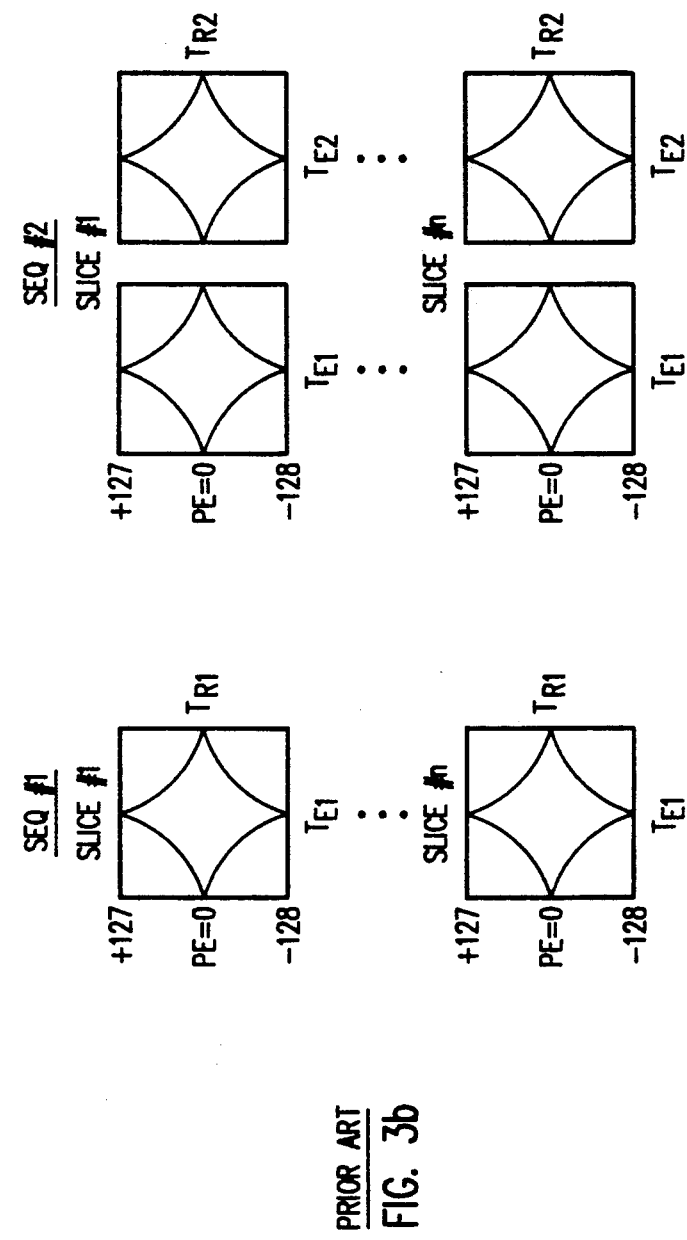
PRIOR ART
FIG. 3a
PRIOR ART
FIG. 3b

METHOD AND APPARATUS FOR THE FORMATION OF A PLURALITY OF NMR IMAGES, EACH HAVING A DIFFERENT CHARACTERISTIC, OF THE SAME SLICE, IN A SINGLE SEQUENCE

This application is submitted with a microfiche appendix, having Exhibit B containing copyrighted material, Copyright 1991, Toshiba American (MRI), Inc. The appendix consists of one (1) microfiche with 34 frames. The copyright owner has no objection to the facsimile reproduction by any one of the patent document or the patent disclosure, as it appears in the Patent and Trademark Office patent file or records, but otherwise reserves all copyright rights whatsoever in th appendix.

TECHNICAL FIELD

The present invention relates to a method and apparatus for the formation of a plurality of NMR images produced from a single sequence. Each of the NMR images has a different characteristic of the same selected nuclei.

BACKGROUND OF THE INVENTION

The formation of NMR images based upon excited nuclei is well known in the art. In general, for a spin echo image, the MRI signal received from a selected set of nuclei is governed approximately by the following relationship:

$$I \propto \rho(h) (1 - e^{-TR/T_1}) e^{-TE/T_2}$$

where
I is the signal strength
$\rho(h)$ is the proton density of the selected nuclei,
$T_1$ and $T_2$ are respectively, the longitudinal and transverse relaxation times of the selected nuclei,
$T_R$ is the repetition time; and
$T_E$ is the echo time.

The parameters $T_R$ and $T_E$ are operator adjustable parameters, while $T_1$, $T_2$ and $\rho(h)$ are magnetic parameters intrinsic to each tissue.

In any NMR imaging process, the investigation seeks to determine the characteristics of the tissue under examination. For an image which is $T_1$ weighted, it means that the image has more contribution from the $T_1$ relaxation time than from the $T_2$ relaxation time or the proton density. Similarly, for a $T_2$ weighted image, it means that the image has more contribution from $T_2$ relaxation time than from $T_1$ relaxation time or the proton density.

In order to produce a $T_2$ weighted image, the parameters $T_R$ and $T_E$ must be adjusted such that $T_R$ is relatively long and $T_E$ is relatively long. For a $T_1$ weighted image, $T_R$ must be relatively short and $T_E$ must be relatively short. For a proton density weighted image, the variable $T_R$ must be relatively long and $T_E$ must be relatively short.

Finally, for clinical diagnosis, it is often desirable to obtain different weighted images simultaneously, of the same tissue or selected nuclei under examination.

In the prior art, to accomplish the formation of a plurality of images having different weighted characteristics of the same selected nuclei, a plurality of separated sequences of the MRI excitation and image re-construction is performed. For example a first sequence may be based upon $T_R$ at approximately 3,000 milliseconds and $T_{E1}$ at 30 milliseconds, and $T_{E2}$ at 80 milliseconds. A second sequence may have $T_R$ set at approximately 500 milliseconds and $T_{E1}$ at 30 milliseconds.

A sequence contains a plurality of contiguous $T_R$ time periods. In the case of a multi-slice/multi-echo sequence, each $T_R$ time period is further divided into a plurality of slice time intervals, during each of which a different physical slice is excited and echo signals are acquired. Prior to the start of each sequence, the MRI instrument must be prepared for the acquisition of the echo signals during that sequence. This is termed the overhead of signal acquisition. Examples of such overhead include: opening and closing of files, checking for sufficient disk space, creating and loading the actual sequence, and adjusting the acquisition hardware such as RF level, receiver gain, and sampling rate. Since MRI instruments are relatively expensive and it is highly desirable to increase the throughput of patient imaging through an MRI instrument, it is desired to cut down the amount of time it takes to generate different images of the same selected nuclei.

In the prior art, it is also known to generate an image of a selected nuclei wherein the repetition time is varied within the single sequence, in order to reduce acquisition time. Thus, see for example, "$T_2$ Weighted Spin Echo Pulse Sequence With Variable Repetition and Echo Times for Reduction of MR Image Acquisition Time", by R. Kim Butts, et al., RSNA, 1991. See also "Intra-Acquisition Modification of Pulse Sequence Parameters" by F. Farzaneh et al., SMRM, 1989.

SUMMARY OF THE INVENTION

Accordingly, in the present invention, a method of NMR imaging in a single sequence for the formation of a plurality of images of the same selected nuclei is disclosed. Each of the images of the same selected nuclei has a characteristic different from the other. The method comprises the steps of eliciting and receiving a first plurality of MRI signals from a plurality of selected nuclei during a first time interval. The first time interval comprises a plurality of first intervals $T_{R1}$ with each first interval $T_{R1}$ in the first time interval being substantially the same. The selected nuclei have their phase encoded by a different magnetic phase encoding gradient during each of the first intervals $T_{R1}$. The method continues to elicit and to receive a second plurality of MRI signals from the same plurality of selected nuclei during a second time interval. The second time interval also comprises a plurality of second intervals $T_{R2}$. However, each of the second interval $T_{R2}$ is different from the first intervals, $T_{R1}$. During the second time interval, the selected nuclei are phase encoded by a different magnetic phase gradient in each of the second intervals $T_{R2}$. The magnetic phase encoding gradients used during the second intervals are the same as or are a subset of those during the first intervals. Finally, the acquired MRI signals are regrouped and processed to generate a plurality of images of the selected nuclei with each image being of the same plurality of selected nuclei but with different characteristics. During the process, portions of the data are used repeatedly.

BRIEF DESCRIPTION OF THE DRAWINGS

FIGS. 3a is a schematic timing diagram of two examples of MR imaging sequences of the prior art, and the echo signals collected therefrom represented as a plurality of K space diagrams (FIG. 3b), prior to each K space data set being fourier transformed to an image of a slice.

FIG. 7c is a refinement of the method of FIG. 7a.

FIG. 9c is a refinement of the method of FIG. 9a.

DETAILED DESCRIPTION OF THE DRAWINGS

Figure 1:
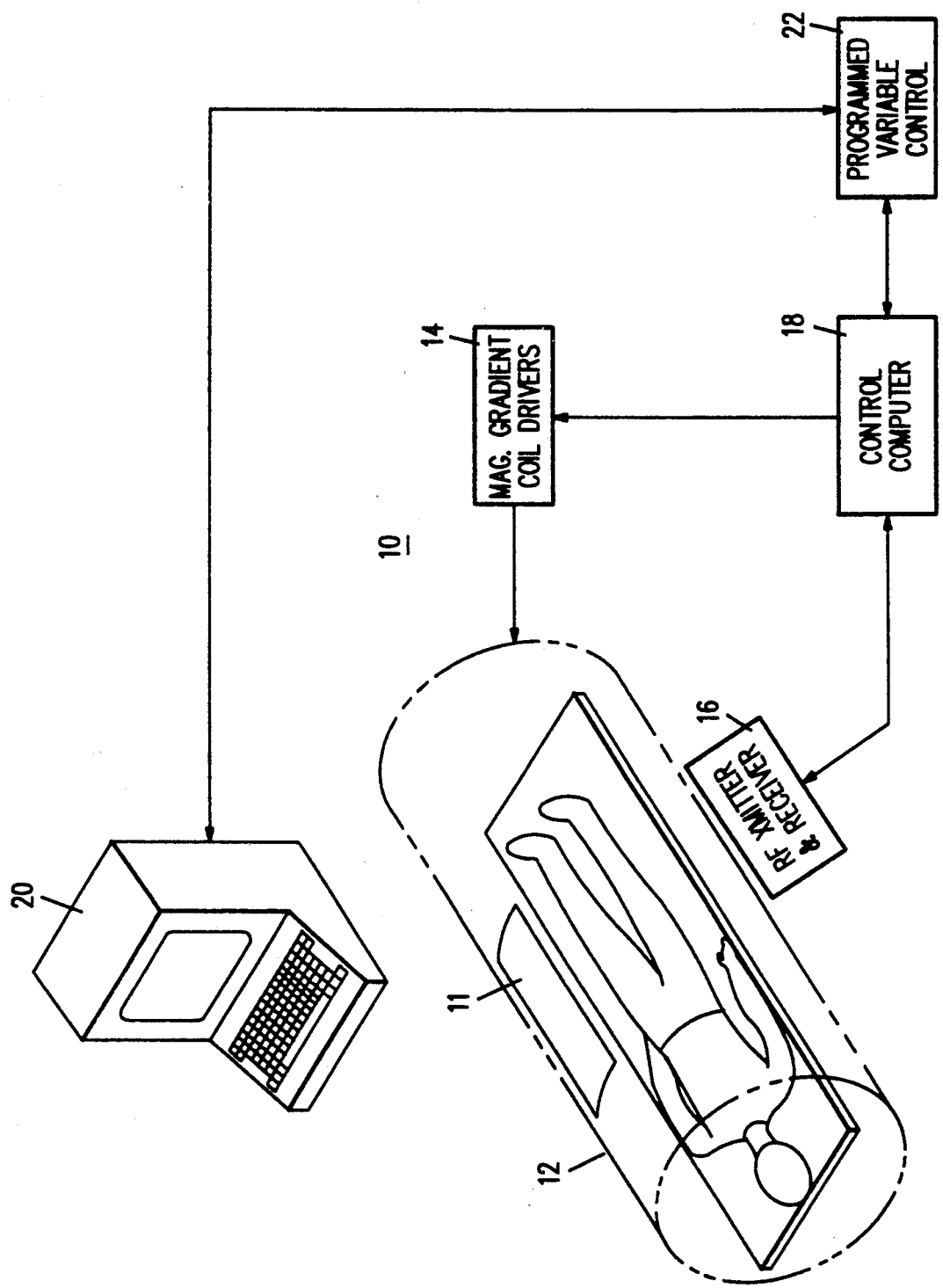
FIG. 1 is a schematic block diagram of an MRI instrument with the present invention.

Referring to FIG. 1 there is shown an MRI instrument 10 suitable for use with the present invention. As is well known, the instrument 10 comprises a magnet 12, such as a superconductive magnet. The magnet 12 is typically cylindrically shaped, in which a patient is placed. The magnet 12 generates a static magnetic field, e.g. along the longitudinal axis of the patient.

The instrument 10 also comprises a plurality of magnetic gradient coils 11. The magnetic gradient coils 11 are driven by a plurality of magnetic gradient coil drivers 14, which supply the electric current to the magnetic gradient coils 11 to generate the necessary magnetic gradient fields. To select a particular "slice" or a group of selected nuclei, then to receive the MRI signal therefrom, the instrument 10 also comprises an RF transmitter and receiver 16. The RF transmitter and receiver 16 and the magnetic gradient coil drivers 14 are under the control of a control computer 18. The control computer 18 communicates with a host computer 22 which contains the programmed variable control. The operator interfaces with the keyboard/display terminal 20, which is connected to the host computer 22.

The timing of the energization of the gradient coils 11, and the RF transmitter and receiver 16 is controlled by a sequence, which is contained in the programmed variable control 22. A protocol file, shown in Exhibit A together with the sequence shown in Exhibit B generate the necessary controls for the host computer 22 to perform the present invention. Exhibit B is in the nature of a microfiche index, and is used by the computer 18 to control the timing of the energization of the gradient coils 11, and of the RF transmitter and receiver 16.

In the preferred embodiment, the MRI instrument 10 is a Toshiba MRT-35, containing a micro VAX computer made by the Digital Equipment Corporation.

Figure 2:
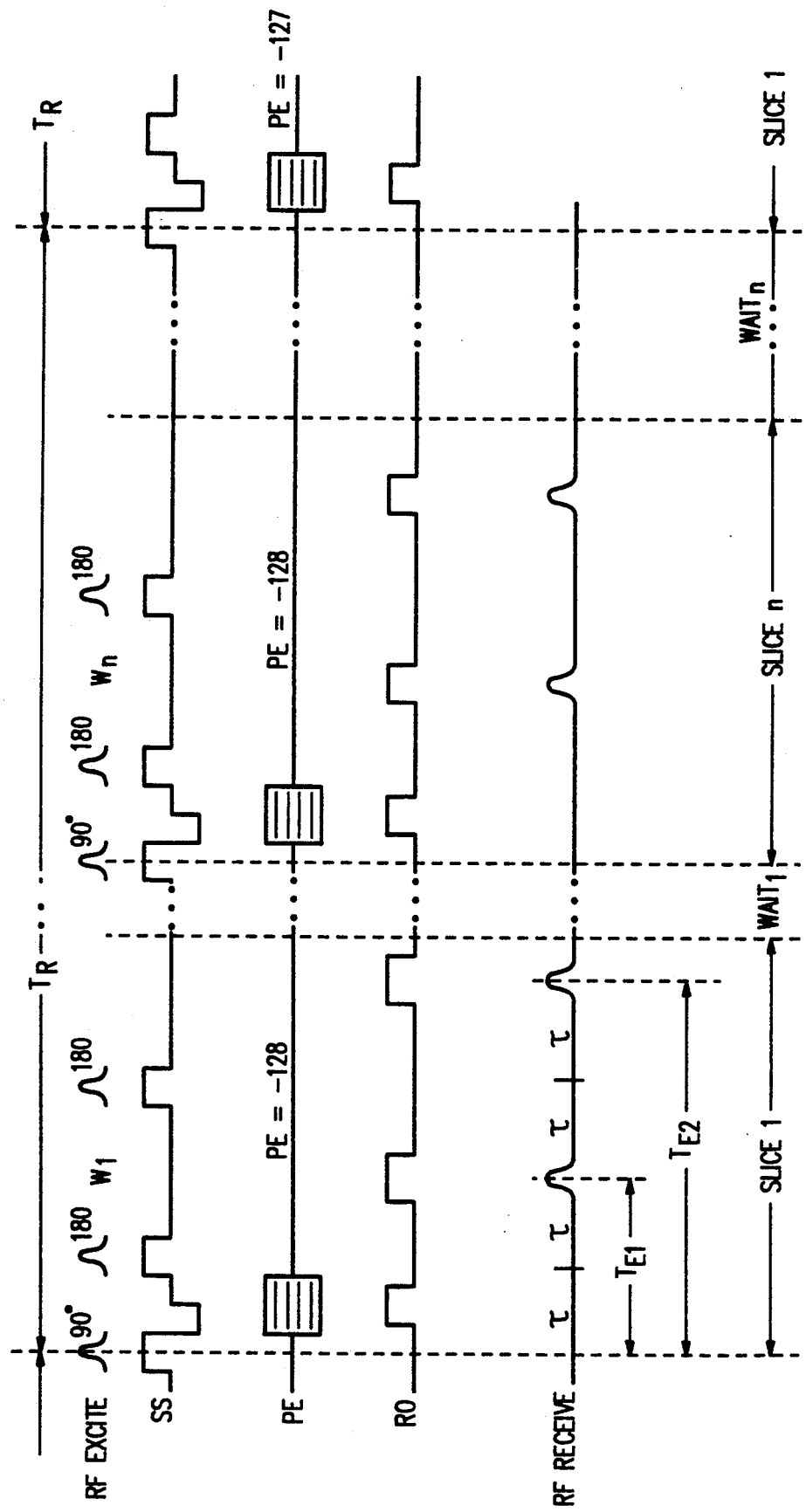
FIG. 2 is a schematic timing diagram of an MR imaging sequence representing the various parameters that are found in a typical MR pulse sequence of the prior art.

The Toshiba MRT-35 MR instrument 10 can perform the present invention which is in the nature of NMR imaging in a single sequence. Each sequence typically comprises a plurality of $T_R$ intervals. A single $T_R$ interval (out of, for example, 256 PE cycles per slice volume in a typical single MRI sequence) is shown in FIG. 2. Each PE cycle is sometimes referred to as a "subsequence" of the overall sequence.

As shown in FIG. 2, a $T_R$ interval comprises a plurality of N slices, or subintervals. At the beginning of each cycle, an RF nutation pulse of $\theta°$ (e.g., 90°) is applied in the presence of a slice select (SS) magnetic gradient pulse (e.g. $G_2$) so as to selectively address a given slice volume of hydrogen nuclei. In that slice subinterval, a phase encoding (or PE) magnetic gradient pulse (e.g. $G_y$) is imposed (e.g., having a magnitude/duration). In that same slice subinterval, a slice selective 180° RF refocusing pulse is applied to produce a first spin echo signal. The spin echo signal is received during the application of the read out (or RO) magnetic gradient (e.g. $G_x$). The first spin echo signal occurs at time $T_{E1}$ from the center of the RF nutation pulse (i.e. 90°).

An A/D converter (not shown) is activated prior to $T_{E1}$ and is turned off shortly after $T_{E1}$, from the center of the nutation pulse. Thus, the RF signal which is centered about $T_{E1}$ is sampled. The digital data is collected and stored in a file containing other first echo signals from that same slice, and with different PE gradient.

If a second spin echo signal is desired to be received, in that same cycle of the same slice, another 180° refocusing pulse is applied. A second read out gradient pulse is applied at or about the time $T_{E2}$ from the center of the nutation pulse. The A/D converter is activated prior to $T_{E2}$ and is turned off shortly after $T_{E2}$, from the center of the nutation pulse. Thus, the RF signal which is centered about $T_{E2}$ is sampled and is digitized. The digital data is collected and is stored in a file containing other second echo signals from that same slice.

After the collection of the second spin echo signal, if any, the time interval for the slice subinterval 1 includes a brief waiting period wait$_1$. During the entirety of the slice subinterval 1, the phase encoding gradient (PE) is set at a first value. As shown in FIG. 2 the phase encoding is set at −128.

During the second slice subinterval of the subsequence $T_R$, the frequency of the RF pulse is varied by a delta amount in order that a different physical slice of selected nuclei is excited and the signals therefrom are read out. The phase encoding gradient, however, is set the same as are the parameters $T_{E1}$ and $T_{E2}$. This continues for N slice subintervals. The sum of all slice subintervals, including the waiting period associated with each slice subinterval equals the desired time duration of $T_R$. Of course, within each subsequence $T_R$, the slice subintervals can proceed from one to another without a waiting period, with one waiting period at the end of the last slice subinterval N.

After the N slice subintervals, the sequence continues with the next subsequence $T_R$. In the next subsequence $T_R$, the above steps are repeated with the phase encoding gradient changed to a different value, e.g. −127.

After all the spin echo signals are collected, the stored spin echo signals for a particular slice, but with different phase encoding gradients thereto, are processed, by for example, using 2DFT or two dimensional fourier transform, to generate an image of the slice. Such processing is well known in the art.

The sequence shown hereinabove is termed a multislice/multiecho sequence wherein a plurality of slices with a plurality of echoes in each slice is read out. Thus, as can be seen from FIG. 2, in a single sequence of the prior art, N×M images (N=number of slices; M=number of echoes in each slice) with each image representing a slice of different selected nuclei and a $T_E$ value can be produced.

As previously stated, however, it is highly desirable in certain aspects to form a plurality of images having different weighted characteristics ($T_1$, $T_2$ or $\rho(h)$) of the same selected nuclei. Referring to FIG. 3a, there is shown a time sequence of the prior art.

In the prior art, this was accomplished by a first sequence wherein, for example, the $T_1$ weighted characteristics of the N slices of images are produced in a first sequence. Thereafter, after a period of delay due to acquisition overhead, as discussed heretofore, a second sequence of NMR imaging is produced. In the second sequence, the appropriate variables such as $T_2$ and $T_R$ are adjusted in order to produce a plurality of N slice images having different weighted characteristics.

Referring to FIG. 3b there is shown a well known depiction of a plurality of files of data, with file representing data from each slice, obtained from the sequence shown in FIG. 3a. The data is represented as a K space representation. In FIG. 3b, for sequence #1, there are N slices; hence there are N K space representations, with a K space representation for each slice. The data contained in each of the K space representations is based upon a value of $T_R$ (small, on the order of 500 milliseconds) and a single value of $T_E$ (also small, on the order of 30 milliseconds). For sequence #2, there are two K space representations for each slice. The K space representations are both based upon a value of $T_R$ (large, on the order of 3,000 millisecond). The K space representations for each slice differ as they are based upon different $T_E$ values.

Figure 4A:
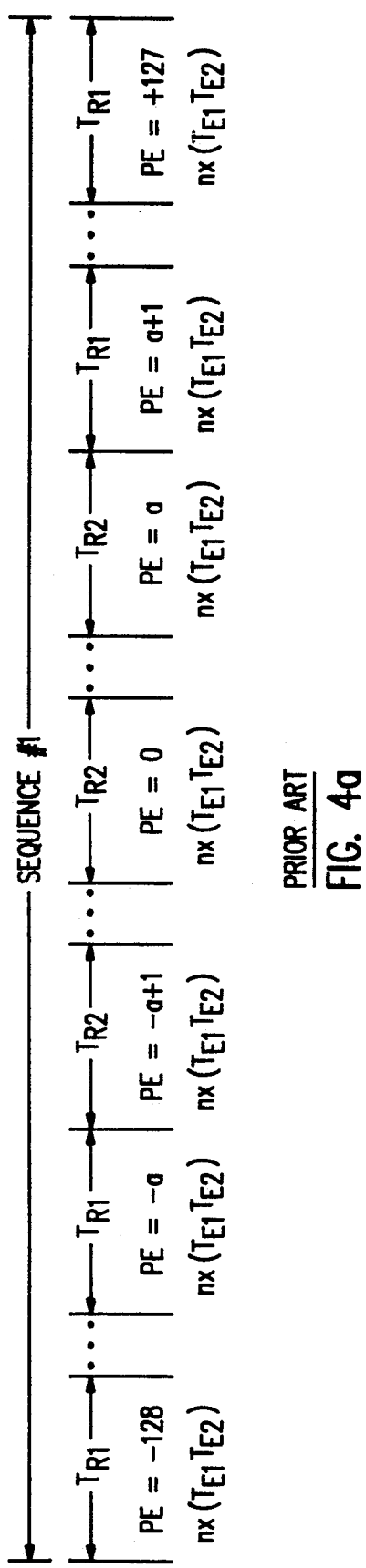
FIGS. 4a is a schematic timing diagram of a single MR imaging sequence of the prior art, and a K space diagram of the echo signals of the ith slice collected therefrom (FIG. 4b), prior to transformation into an image of the ith slice.
Figure 4B:
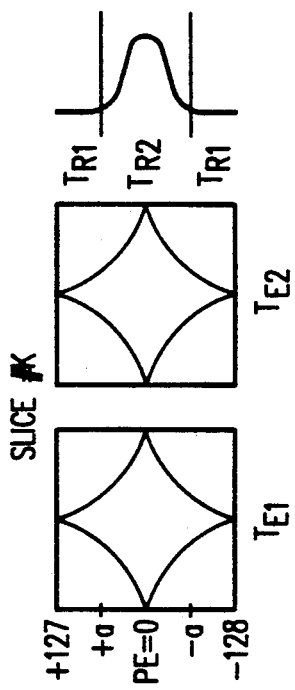

Referring to FIG. 4a there is shown another prior art sequence. In this sequence, a single sequence is shown wherein the operator adjustable variables $T_R$ is varied within the single sequence. During a portion of the sequence, the echo signals are received with $T_R=T_{R1}$. In another portion of the sequence, the echo signals are received with $T_R$ different from $T_{R1}$, with $T_R$ making a gradual transition from $T_{R1}$ to $T_{R2}$, and then back to $T_{R1}$. Thus, the repetition time $T_R$ and the echo time $T_E$ can be both varied in the same single sequence. This sequence is discussed hereinabove in the Background, by Butts et al. See, also, U.S. patent application Kaufman et al., entitled "MRI Using Variable Imaging Parameter(s) Within a Single Image Sequence", assigned to The Regents of the University of California (Attorney's Reference No. 89-171). Such a sequence generates a single image of a group of selected nuclei for each echo.

Figure 5:
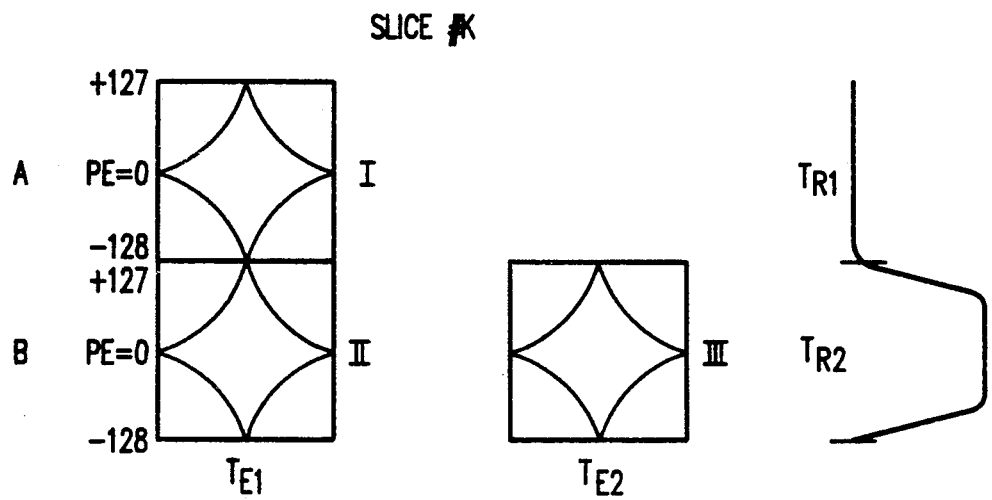
FIG. 5 is a K space diagram of the data collected from one slice, of one embodiment of the MR imaging sequence of the present invention, prior to transformation into an image of the slice.

Referring to FIG. 5 there is shown a K space representation of the data for a slice of selected nuclei acquired in one method of the single sequence of the present invention. The single sequence comprises two time intervals (A and B). In the embodiment shown in FIG. 5, the first time interval (A) is comprised of a plurality of subsequences, e.g. 256, with PE ranging in value from −128 to +127 gradient unit, with each subsequence being $T_{R1}$ in duration, and with only one echo signal $T_{E1}$ being received.

The second time interval (B) excites and receives a second plurality of MRI signals from the excitation of the same plurality of selected nuclei as during the first time interval (A). During this second time interval, again, the phase encoding gradient would be cycled through 256 possible values from −128 to +127. For each of the 256 subsequences, the variable $T_R$ would be different, i.e. $T_{R2}$ and with two echo signals $T_{E1}$ and $T_{E2}$ obtained in each subsequence.

After the MRI signals from the first interval and from the second interval are collected, they are separated and processed by conventional processing means such as 2DFT to generate a plurality of images of the same slice but with each image being of different weighted characteristics.

Thus, in the example shown in FIG. 5 there are three possible weighted images for each slice of selected nuclei. The images are:

| | | |
|---|---|---|
| (I) | $T_{E1}$ and $T_{R1}$ | $T_1$ weighted |
| (II) | $T_{E1}$ and $T_{R2}$ | $\rho(h)$ weighted |
| (III) | $T_{E2}$ and $T_{R2}$ | $T_2$ weighted |

As can be seen from the sequence shown in FIG. 5, with the single sequence of the present invention, the "set up time" between sequences is eliminated. This speeds up the acquisition of different weighted MR images of the same selected nuclei.

Figure 6A:
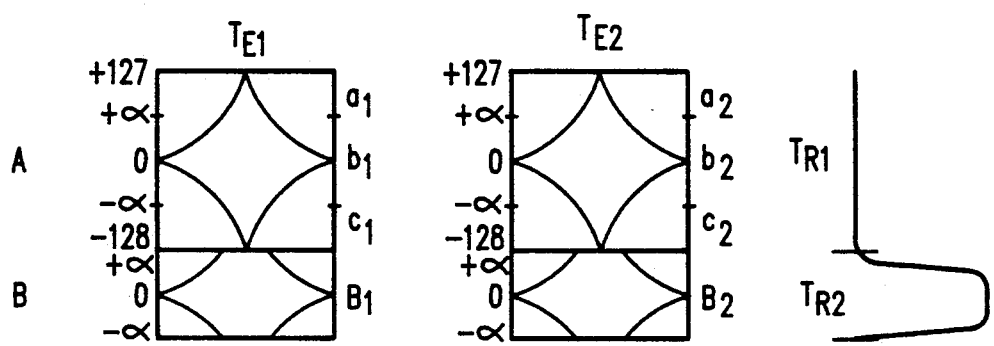
FIG. 6a is a K space diagram of the data collected from one slice, of another embodiment of the MR imaging sequence of the present invention, and the regrouping of the collected data (FIG. 6b), prior to transformation into an image of the slice.

Referring to FIG. 6a, there is shown another K space representation of the data for a slice of selected nuclei acquired in another embodiment of the method of the present invention. In the embodiment shown in FIG. 6a, the sequence again comprises two contiguous time intervals (A and B). In the time interval (A), the phase encoding magnetic gradient is cycled through the entire range from −128 to +127, thereby generating 256 subsequences. Each of the subsequences is $T_{R1}$ in duration. However, two echo signals $T_{E1}$ and $T_{E2}$ are acquired in each of the subsequences.

During the second time interval (B), however, the phase encoding magnetic gradient is cycled only through values $-\alpha$ to $+\alpha$. These values represent a subset of the phase encoding values during the first time interval, and center about the value of phase encoding equal 0. Thus, only $2\alpha$ subsequences of MRI signal acquisition is performed in the second time interval (B). During the $2\alpha$ subsequences, $T_R$ is gradually changed from $T_{R1}$ to $T_{R2}$ and then gradually back to $T_{R1}$, as shown in FIG. 6a.

Figure 6B:
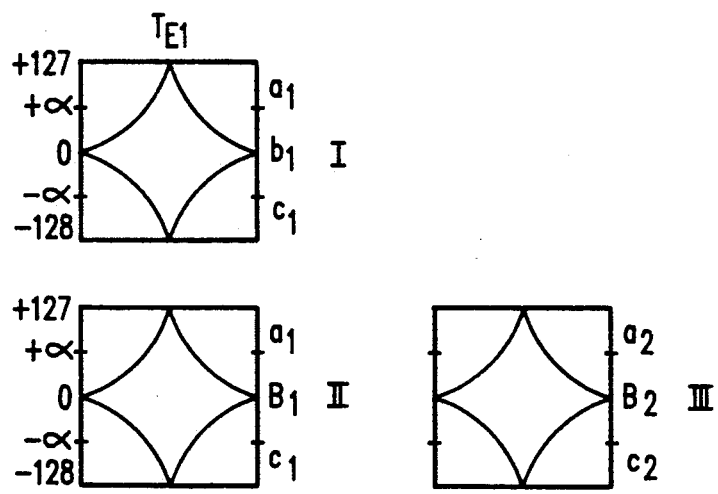
FIG. 6c is a refinement of the method shown in FIG. 6a, with the regrouped data shown in FIG. 6d.

Once the data for each slice is collected, they are regrouped in accordance with that shown in FIG. 6b. Three files of new, regrouped K space data are formed. The $T_{E1}$ echo signals for each slice, for the first time interval, i.e. acquired when $T_R=T_{R1}$, is divided into three parts:

$a_1$ for the signals when PE=$\alpha+1$ to PE=+127;
$b_1$ for the signals when PE=$-\alpha$ to PE=$+\alpha$;
$c_1$ for the signals when PE=$-128$ to PE=$-\alpha-1$.

Similarly the echo signals for the $T_{E2}$ signals are divided into three parts: $a_2$, $b_2$, and $c_2$. The echo signals acquired during the second time interval (B) are $B_1$, and $B_2$ signals for echo signals $T_{E1}$ and $T_{E2}$ respectively.

The regrouping produces three files of data:

$a_1+b_1+c_1$          (I)

$a_1+B_1+c_1$          (II)

$a_2+B_2+c_2$          (III)

with $a_1$ and $c_1$ used repeatedly (twice). Exhibit C contains software routines to accomplish the regrouping of the data. These three data files are then reconstructed using fourier transformation to produce three images of the particular slice, having weighted characteristics.

In addition, the following data files, when fourier transformed to images, may provide clinically significant images:

$a_1+(B_1-b_1)+c_1$ and $a_2+(B_2-b_2)+c_2$.

Figure 6C:
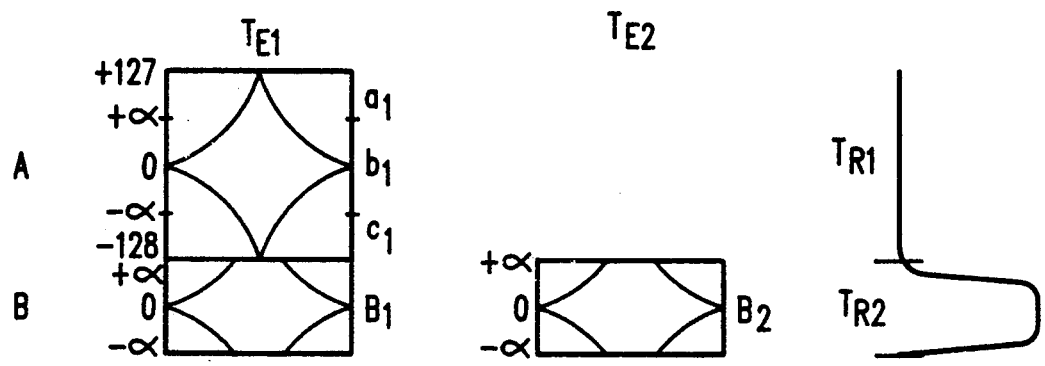

Referring to FIG. 6c, there is shown a variation of the embodiment of the method of the present invention to increases the number of slices. During the transition from $T_{R1}$ to $T_{R2}$ either a) two echoes can be acquired with $T_E$ varying with $T_R$; or b) only the first echo is acquired and the data is shared by both echoes during reconstruction.

In this method, the second echo signals $T_{E2}$ acquired during $T_{R1}$, i.e. $a_2$, $b_2$, and $c_2$ are eliminated. Thus, during the first time interval (A) when $T_R = T_{R1}$, only one echo signal is acquired during each subsequence. The regrouping of the three data files, when fourier transformed to produce the three different weighted images, would be as follows:

$a_1+b_1+c_1$          (I)

$a_1+B_1+c_1$          (II)

$a_1+B_2+c_1$          (III)

with $a_1$ and $c_1$ used repeatedly (thrice). When these data files are fourier transformed, the images would again be representative of the weighted images described heretofore. Image transformed from the data file, $a_1+B_2+c_1$, is similar to the image transformed from the data file $a_2+B_2+c_2$, because the phase encoding signals, near PE=0 contains the most of the contrast data.

Since it is well known that MRI signals received can be used to calculate the conjugate of the MRI signals, another embodiment of the present invention utilizes this in order to reduce yet further the time required to acquire the MRI signals in order to produce the plurality of images per slice, or to increase the number of slices in the same acquisition time period.

Figure 7A:
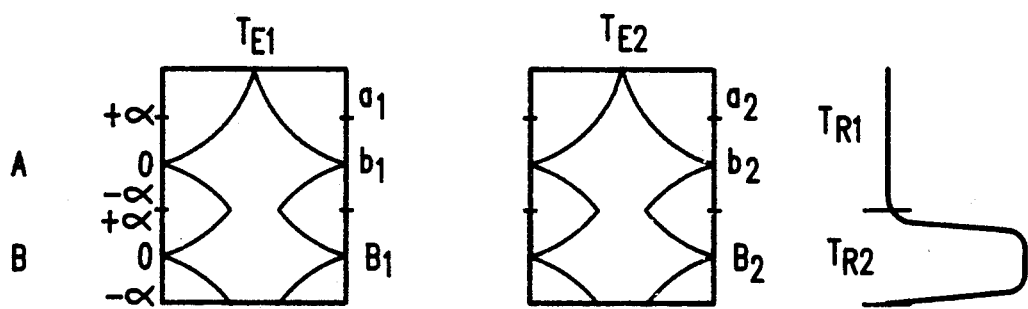
FIG. 7a is a K space diagram of the data collected from one slice, of yet another embodiment of the MR imaging sequence of the present invention, and the regrouping of the collected data (FIG. 7b) prior to transformation into an image of the slice.
Figure 7B:
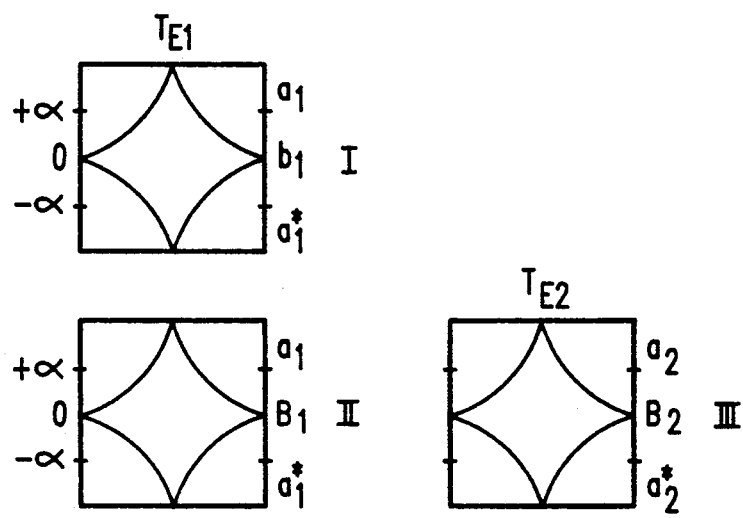

Referring to FIG. 7a there is shown another embodiment of the single sequence of the present invention. Again, similar to the foregoing discussion, the single sequence is divided into two contiguous time intervals A and B. During the first interval (A), however, the MRI signals are not acquired by cycling the phase encoded magnetic gradient through the entire range of values. Instead, during the first interval, only $\alpha+128$ subsequences are generated. Each of the subsequence, again, is of $T_{R1}$ in duration, with two echo signals acquired during each subsequence. During the second time interval (B), however, the MRI signals are again cycled through the phase encoding range $-\alpha$ to $+\alpha$. In this time interval (B), $2\alpha$ subsequences are formed, with $T_R$ different from $T_{R1}$, with $T_R$ making a gradual transition from $T_{R1}$ to $T_{R2}$ and then back to $T_{R1}$. Again during this time interval B, two read out echo signals per subsequence are acquired.

In the regrouping of the data, since the MRI data between PE$=-128$ and PE$=-\alpha-1$ can be recovered by complex conjugate of the data from $+\alpha+1$ to $+128$, the following data files are formed:

$a_1+b_1+a_1^*$          I.

$a_1+B_1+a_1^*$          II.

$a_2+B_2+a_2^*$          III.

where is the conjugated data. The fourier transformation of these data files would produce the weighted images.

In addition, similar to the embodiment shown in FIG. 6, the following alternative data files, when fourier transformed would produce images which may have clinical significance:

$a_1+(B_1-b_1)+a_1^*$; and $a_2+(B_2-b_2)+a_2^*$.

Figure 6D:
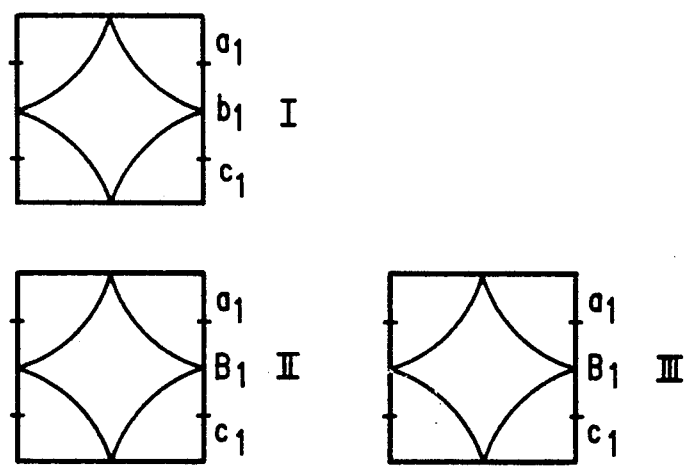

Similar to the embodiment shown and described in FIGS. 6c and 6d, the second echo signal $T_{E2}$ during the first time interval A, i.e. during subsequences having $T_{R1}$ in duration, can be skipped to accommodate more slices. The resultant data files are shown in FIG. 7(c).

Figure 7C:
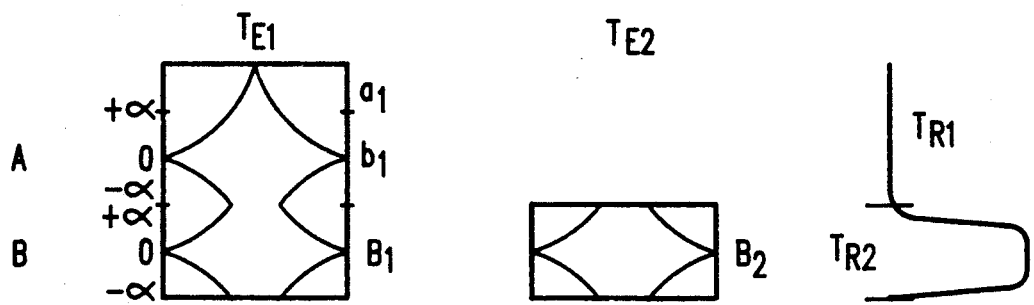

In the regrouping of the data files from the data acquired in the method shown in FIG. 7(c), the following data files are regrouped:

$a_1+b_1+a_1^*$          I.

$a_1+B_1+a_1^*$          II.

$a_1+B_2+a_1^*$          III.

here echo data are mixed, i.e. data from the first echo, $a_1$, are grouped in a file with echo data from the second echo, $B_2$.

Figure 8A:
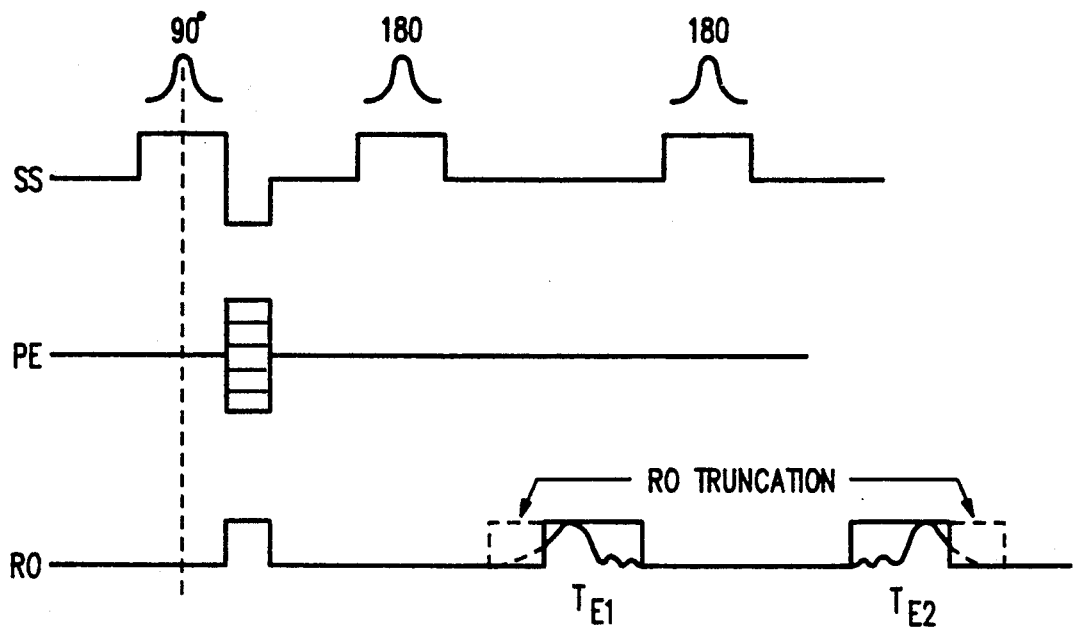
FIG. 8a is a timing diagram showing forward and backward read-out truncation.
Figure 8B:
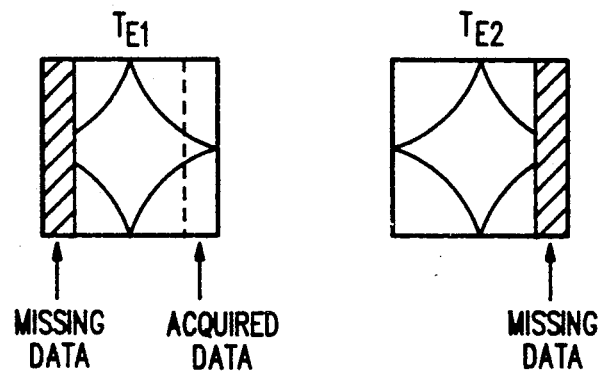
FIG. 8b is a K space representation of the data for a slice in which read-out truncation is applied.

It is also well known that the echo signal may be truncated on one side in the read-out direction, with the truncated data, either being restored by using conjugated data, as described heretofore, or simply zeroed for fourier transformation purpose. Referring to FIG. 8(a) there is shown a timing diagram of the acquisition of one echo signal, during one subsequence, with truncated read-out gradient, and truncated sampling by an analog-to-digital (A to D) converter (not shown). Applying this truncation throughout the sequence would result in a K space representation of one slice, as shown in FIG. 8(b), with missing data (TD). The missing data (TD) can be calculated by the complex conjugate of the acquired data, as shown, or it can be simply left as zero fill, as the fourier transform thereof would not significantly affect th image contrast.

Figure 9A:
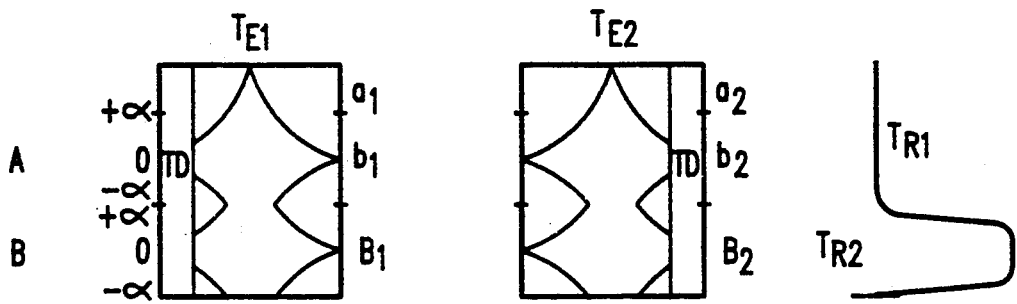
FIG. 9a is a K space diagram of the data collected from one slice, of still yet another embodiment of the MR imaging sequence of the present invention, and the regrouping of the collected data (FIG. 9b) prior to transformation into an image of the slice.

Referring to FIG. 9a there is shown another embodiment of the single sequence of the present invention, employing data in both the readout and phase encoding direction. Again, similar to the foregoing discussion, the single sequence is divided into two contiguous time intervals A and B. During the first interval (A), similar to that shown in FIG. 7(a), $\alpha + 128$ subsequences are generated. Each of the subsequence, again, is of $T_{R1}$ in duration, with two echo signals acquired during each subsequence. In addition, each of the echo signals is truncated forward and backward, respectively.

During the second time interval (B), the MRI signals are cycled through the phase encoding range $-\alpha$ to $+\alpha$. In this time interval (B), $2\alpha$ subsequences are formed, with the subsequence duration $T_R$ being gradually changed from $T_{R1}$ to $T_{R2}$ and then back to $T_{R1}$. Again during this time interval B, two echo signals per subsequence are acquired, with read-out gradient truncation for each of the echo signals.

In the regrouping of the data, since the MRI signals from $-128$ to $-\alpha - 1$ phase encoded magnetic gradient is the conjugate of those from $+\alpha + 1$ to $+128$, the following data files are formed:

$a_1 + b_1 + a_1^*$      I.

$a_1 + B_1 + a_1^*$      II.

$a_1 + B_2 + a_2^*$      III.

where * is the conjugated data. In addition, the truncated read-out signal for each of the echoes, may be zero filled or may be filled with conjugated data. The fourier transformation of these data files would produce the weighted images.

In addition, the following alternative data files, when fourier transformed would produce images which may have clinical significance:

$a_1 + (B_1 - b_1) + a_1^*$; and $a_2 + (B_2 - b_2) + a_2^*$.

Similar to the embodiment shown and described in FIGS. 7c and 7d, by eliminating the second echo signal $T_{E2}$ during the first time interval A, i.e. during subsequences having $T_{R1}$ in duration, more slices can be accommodated. The resultant data files are shown in FIG. 9(c).

Figure 9B:
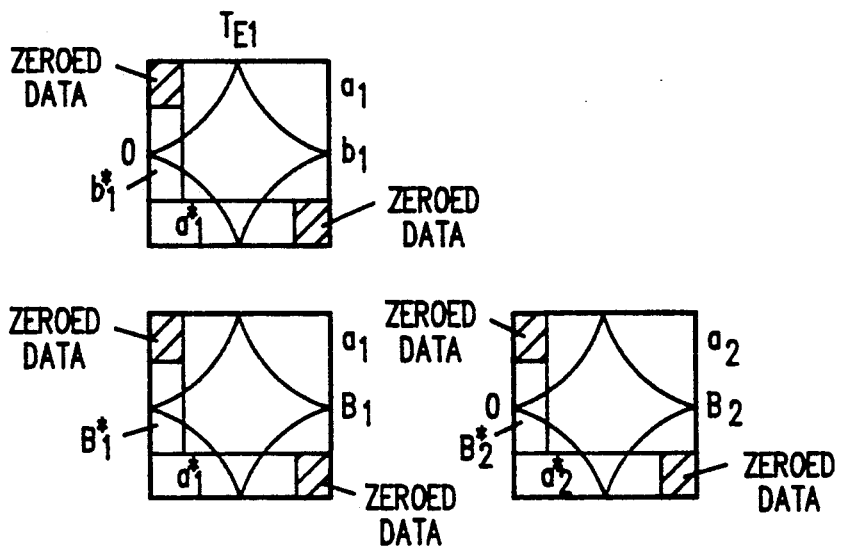
Figure 9C:
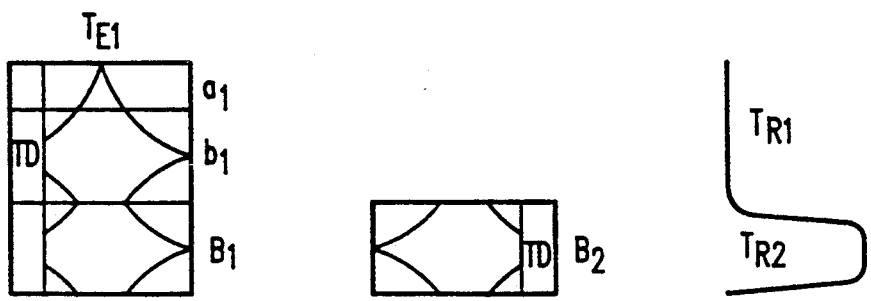

In the regrouping of the data files from the data acquired in the method shown in FIG. 9(c), the following data files are regrouped:

$a_1 + b_1 + a_1^*$      I.

$a_1 + B_1 + a_1^*$      II.

$a_1 + B_2 + a_1^*$      III.

again with the truncated read-out signals either zero filled, or filled by conjugated data. An advantage of the method of FIG. 9 is that the number of slices can be increased, because $T_R$ per slice is reduced with forward and backward truncation of the first and second echoes.

From the foregoing, it can be seen that a new improved method and apparatus of the present invention is disclosed wherein in a single sequence, a plurality of images for the same group of selected nuclei with each of the images having different contrast characteristics of the group of selected nuclei is disclosed. In several embodiments, the data is regrouped and portions are reused to form multiple data files prior to fourier transformation of each data file to an image. The method and apparatus permits more rapid acquisition of MRI signals and more efficient use of the acquired data, and permits greater patient throughput in MRI instruments. In all of the prior art, each magnetic phase encoding gradient value is used only once in a single sequence. In the present invention, common to all the embodiments, at least a portion of the magnetic phase encoding gradient values are repeatedly used in the same sequence.

EXHIBIT A

```
! TOSHIBA MRT-35A PROTOCOL  8-May-1991 11:58   ISW 5.0
!----------------------------------------------------------------
!       ALL IN ONE, ALL IN ONE, ALL IN ONE !!!!
!----------------------------------------------------------------
!RCV COIL: Head              XMT COIL: Head
!SEQUENCE: Matched Bandwidth
!GATE:     No                SPECIAL: None         RUN MODE: Normal
!ORIENT: Transaxial          PHASE:   L - R
!                                                  ------------------
!THICK:    5.0 mm            TE:     30/80 ms      Head First/Supine
!                                                  Acq. Time:  0.9
!                            TR:    300/3000ms     # of Coverages:  1
!                            SLICES: 1
!                                                  ------------------
!
!FOV:    28.2 x 20.7 cm      RES:  1.10 x 1.10 mm
!MATRIX: 256 x 188           NEX:  1
!
!R OFFSET: 0.00 mm           S OFFSET: 0.00 mm     SEPARATION: 5.50 mm
!----------------------------------------------------------------
       45       ! POWER Coil power level
      116       ! SRATE: sampling rate in us
  256, 202, 256, 0, 0    ! NPTS, NGRAB(1st echo), NGRAB(2nd echo)
     0.90      ! Filter: Multiplier for Low pass filter bandwidth
  10240.0     ! WTIME Transmit sinc Waveform duration in us
   96, 175, 0, 0   ! LEVEL: A B scaler for sinc waveform in db.
   32, 32, 0.300, 2, 1    ! GAIN: START_GAIN, LEVEL_GAIN,TR, IMA, GAIN_SEARCH
 P20(P2:3)S1>1H1P23;C1;L1          ! PLEVEL
 (P10:12P15)S1P18P19/P20(P40)S1>1H1P22P23;C95;L1 ! PGAIN
 CUS:AIO.001
```

```
YXZ,YXZ, 0, 0, 0, 0        ! DIRM, DIRP, Oblang(1), Oblang(2), Locator file/image
188, 0  ! ENCODING: Number of PE/SE projections acquired
1, 1    ! NPL,NSL Slices per Pcom., Total slices
1.100, 1.100, 5.000,0.000         ! Voxel size (RO,PE,SS), PAT_RO_OFFSET mm
1,    0, 26, 90, 0, 0, 0       ! PCOM,CR,AFI,FLIP,BHOLD,GREV,DYNAMIC
(P10:12P15)S1P18P19/P20(P40)S1>1H1P22;C1:188/1;L1
2, 0.300, 1, 0.000, 56, 0, 0, 0, 0   ! Image,Tr,No of Acq,Ti,Acq Time,Gate Flags
0.000, 0.030, 1
0.000, 0.080, 5
```

EXHIBIT C

```c
#include "inc:stddef.h"
#include "inc:tpdhdf.h"
#include "inc:dirhdc.h"
#include "inc:filhdc.h"
#include "inc:imghdc.h"

struct FILHED outfilhed;
struct IMGHED outimghed;

#define NO -18
#define True 1
#define False 0
#define Dirblk 0
define LINELENGTH 134 int getinfo (int chan)
{
        int rdwords, wtwords;
        int quit = True;
        int done = False;
        int i, j;
        char filelst [MAXFILES];

short ireadw (), iwritw ();
        int getfiles ();

/* read the directory header block. */
        rdwords = ireadw (&(DIRHEDBYTES/2), &dirhed, &Dirblk, &chan);
        if (rdwords != DIRHEDBYTES/2)
                {
                uierror ("Directory header read error");
                return (0);
                } ttpos (&1, &1);
        printf ("File(s)");
        if (dirhed.nfiles != 0)
                {
                for (i = 0; i < MAXFILES; i++)
                        {
                        if (dirhed.filptr [i] != 0)
                                {
                                filelst [i] = 1;
                                for (j = i + 1;
                                    j < MAXFILES && dirhed.filptr[j] != 0; j++)
                                        filelst [j] = 1;
                                filelst [j] = 0;
                                if (j == i +1)
                                        printf (" %d,", i+1);
                                else
                                        printf (" %d-%d,", i+1, j);
                                i = j;
                                }
                        else
                                filelst [i] = 0;
                        }
```

```
                printf ("\010 in run %s.\n\n", dirhed.runno);
                }
        else
                {
                printf ("No files in run %s.\n\n", dirhed.runno);
                return (0);
                } while (!(done = getfiles (filelst, chan)));
        quit = done == -1;
        if (!quit)
                {
                /* write the directory header block back to the disk. */
                wtwords = iwritw (&(DIRHEDBYTES/2), &dirhed, &Dirblk, &chan);
                if (wtwords != DIRHEDBYTES/2)
                        {
                        uierror ("Directory header write error");
                        return (0);
                        }
                } return (1);
}
int getfiles (char filelst[], short dirchan)
{
char filetext [LINELENGTH];
char infilename  [FileNameLength];
char outfilename [FileNameLength];
int HKey;
int infile = 0;
int outfile = 0;
int firstlines = 34;
int midlines = 60;
int lastlines = 34;
short in_img, out_img;
int rdwords, wtwords;
int lines_idx = 1;
short inchan, outchan;
char r50nam [4];
short size, reqsiz;

short filopn (), ireadw (), iwritw ();

ttpos (&4, &1);
        UIAskI("Which file do you want to permute: ", &1, NULL, NULL,
                NULL, NULL, &infile, &HKey);
        if (infile == 0) return (-1);
        if (!filelst [infile -1])
                {
                printf ("Sorry, that file does not exist");
                return (0);
                }
        UIAskI("What file do you want to create: ", &1, NULL, NULL,
                NULL, NULL, &outfile, &HKey);
        if (outfile == 0) return (-1);
        if (filelst [outfile -1])
                {
                printf ("Sorry, that file already exists.");
                return (0);
                }

/* read the file header block. */
        rdwords = ireadw (&(FILHEDBYTES/2), &filhed,
                        &dirhed.filptr[infile -1], &dirchan);
        if (rdwords != FILHEDBYTES/2)
                {
                uierror ("File header read error");
```

```
                    return (0);
                    } if (infile < 10)
        sprintf (infilename, "img:%s.T0%d", dirhed.runno, infile);
else
        sprintf (infilename, "img:%s.T%d", dirhed.runno, infile);
inchan = filopn (infilename, r50nam, "IMG", "000000", "T00",
                "old", &NO, &size, &reqsiz);
if (inchan < 0)
        {
        printf ("Open failed for run %s.", infilename);
        return (0);
        } if (outfile < 10)
        sprintf (outfilename, "img:%s.T0%d", dirhed.runno, outfile);
else
        sprintf (outfilename, "img:%s.T%d", dirhed.runno, outfile);
reqsiz = 2 * (firstlines + midlines + lastlines) * 4;
outchan = filopn (outfilename, r50nam, "IMG", "000000", "T00",
                "new", &NO, &size, &reqsiz);
if (outchan < 0)
        {
        printf ("Open failed for run %s.", outfilename);
        filcls (&inchan);
        return (0);
        } memcopy (&outfilhed, &filhed, sizeof(struct FILHED));
outfilhed.filno = outfile;
outfilhed.presrt = firstlines + midlines + lastlines;
outfilhed.filnpt [lines_idx] = firstlines + midlines + lastlines;
outfilhed.prcsed = NO;
outfilhed.nimage = 2*filhed.nimage;
dirhed.filptr[outfile -1] = dirhed.nxtfre++;

for (in_img = 0; in_img < filhed.nimage; in_img++)
        {
        /* read the image header block. */
        rdwords = ireadw (&(IMGHEDBYTES/2), &imghed,
                        &filhed.imgptr[in_img], &dirchan);
        if (rdwords != IMGHEDBYTES/2)
                {
                uierror ("Image header read error");
                filcls (&inchan);
                filcls (&outchan);
                return (0);
                }
        memcopy (&outimghed, &imghed, sizeof(struct IMGHED));
        outimghed.scnpts[1] = firstlines + midlines + lastlines;
        outimghed.afiacq -= 8; /* ? */ for (out_img = 2*in_img; out_img < 2*in_img + 2; out_img++)
                {
                outfilhed.imgptr[out_img] = dirhed.nxtfre++;
                outimghed.imgno = out_img +1;
                /* write the image header block. */
                wtwords = iwritw (&(IMGHEDBYTES/2), &outimghed,
                                &outfilhed.imgptr[out_img], &dirchan);
                if (wtwords != IMGHEDBYTES/2)
                        {
                        uierror ("Image header write error");
                        filcls (&inchan);
                        filcls (&outchan);
                        return (0);
                        }
                }
```

```
/*              if (!copydata (in_img, 0, firstlines, inchan, outchan, 0))
*/              if (!copydata (in_img, 0, firstlines, -1, outchan, 0))
                        {
                        uierror ("Error copying (first) data");
                        filcls (&inchan);
                        filcls (&outchan);
                        return (0);
                        } if (!copydata (in_img, firstlines, firstlines+midlines,
                        inchan, outchan, midlines+lastlines))
                        {
                        uierror ("Error copying (middle) data");
                        filcls (&inchan);
                        filcls (&outchan);
                        return (0);
                        }
/*              if (!copydata (in_img, firstlines+midlines,
                        firstlines+midlines+lastlines, inchan, outchan, 0))
*/              if (!copydata (in_img, firstlines+midlines,
                        firstlines+midlines+lastlines, -1, outchan, 0))

{
                        uierror ("Error copying (last) data");
                        filcls (&inchan);
                        filcls (&outchan);
                        return (0);
                        }
                } /* for in_img ... */

/* write the file header block. */
        wtwords = iwritw (&(FILHEDBYTES/2), &outfilhed,
                &dirhed.filptr[outfile -1], &dirchan);
        if (wtwords != FILHEDBYTES/2)
                {
                uierror ("File header write error");
                filcls (&inchan);
                filcls (&outchan);
                return (0);
                } filcls (&inchan);
        filcls (&outchan);

dirhed.nfiles++;
        return (1);
} copydata (      int in_img,
                int startline,
                int endline,
                int inchan,
                int outchan,
                int sec_line)

{
short blkoff;
short indx;
int out_img;
int in_line;
char buff [2048];
int i, line;
short debug = 0;
int read_once;

short iread2 (), iwrit2 (), findblock ();

if (inchan < 0)
```

```
                for (i = 0; i < 2048; i++) buff [i] = 0;

for (line = startline; line < endline; line++)
                {
        read_once = False;
        for (out_img = 2*in_img; out_img < 2*in_img + 2; out_img++)
                {
                in_line = line + (out_img %2) * sec_line;
                if (inchan >= 0 && !read_once)
                        {
                        read_once = sec_line == 0;
                        blkoff = findblock (in_img +1, in_line +1, 1024, 188, 2,
                        if (iread2 (&'w', &512, buff, &blkoff,
                                &inchan, NULL, NULL, "Image", &debug ) != 51
                                return (0);
                        } blkoff = findblock (out_img +1, line +1, 1024, 128, 4, &indx);
                if (iwrit2 (&'w', &512, buff, &blkoff,
                        &outchan, NULL, NULL, "Image", &debug ) != 512)
                        return (0);
                } /* for out_img ... */
        } /* for line ... */
return (1);
} memcopy (char *o, char *i, int s)
{
        while (s--)
                *o++ = *i++;
}
#include "inc:scrfmt.h"        /* UIFlib screen format definitions */
#define True 1
#define False 0
#define NO -18
define TDFLAG True define LINELENGTH 134 define TAB 9
define SPACE 32
#define EOS 0
define NULL 0 main()
{

/* local scratch space */
char run [LINELENGTH];
char filename [LINELENGTH];
int p;
int done = False;
char r50nam [4];
int size, reqsiz;
int HKey;
short chan;

/* Executable statements ... */

UIInit();       /* initialize the UI library*/
uiacns ();
uisfmt (&0, &WholeScreen);
uipscr (&0);
ttclr ();

do
```

```
        {
        run [0] = EOS;
        ttpos (&24, &1);
        UIAskS ("Enter run number ('*' for list, <RETURN> to exit): ",
                NULL, NULL, &LINELENGTH, run, &HKey);
        run [LINELENGTH] = EOS;
        for (p = 0; run [p] != EOS; p++)
                if (run [p] != SPACE && run [p] != TAB) break;

if (run [p] == '*')
                rundir (TDFLAG);
        else if (!strlen (&run [p]))
                done = True;
        else
                {
                sprintf (filename, "img:%s.td", run);
                chan = filopn (filename, r50nam, "IMG", "000000", "TD",
                        "old", &NO, &size, &reqsiz);

if (chan >= 0)
                        {
                        getinfo (chan);
                        filcls (&chan);
                        }
                else
                        {
                        ttpos (&25, &1);
                        printf ("Open failed for run %s.", filename);
                        }
                }
        } while (!done);

ttclr ();
        }
/*-----------------------------------------------------------------
* NAME
*       rundir.c - to list runs on the system
*
* DESCRIPTION
*       To list "runs" in the format:
*               nnnnnn.pd;n             <patient name field text>
*               ...                     ...
*                       nnnnnn free blocks.
*
* NOTES
*       "Runs" reside and can be found with the file specification
*       described by the symbol FILESPEC.
*       Return: If $parse fails return value will be appropriate RMS error
*               code otherwise SS$_NORMAL.
*
* HISTORY
*       06Sep84 REM     Created - adapted from RUNDIR.MAR (GWM).
*       10Sep84 REM     Fixed error reporting. Added output title.
*       03Oct84 REM     free block fail prints count unavailable; double
*                       escape (\\) all carriage control chars in UI--- calls.
*                       Allow multi-screen write with <CR> continue prompt.
*       02Nov84 REM     Fixed addressing of res_string and expand_string.
*       25May88 ABM     Prompt at end if not in Command Mode
*       08May91 gwm     generalized to take optional "TD" flag argument.
*-----------------------------------------------------------------*/

/* definitions */
#include <stdio>.h
#include "inc:stddef.h"
#include fab                            /* FAB definitions    */
#include rab                            /* RAB definitions    */
#include nam                            /* NAM Block definitions */
```

```
#include rmsdef                              /* RMS error codes       */
#include ssdef                               /* system error codes    */
#include "inc:scrolling_region"              /* screen output defs    */
include "inc:option"                        /* menu defintions       */ define    FILESPEC        "img:*.pd;*"
define    TDFILESPEC      "img:*.td;*"
#define    NULL            0
#define    MAX_REC_SIZE    512
#define    SCREEN_SIZE     21                /* # viewable lines in port */
#define    LINE_LIMIT      4                 /* fixed <LF> count      */

/* global data */
    struct FAB fab;
    struct RAB rab;
    struct NAM nam;

char    *pd_spec = FILESPEC;             /* .PD file specification */
    char    *td_spec = TDFILESPEC;           /* .TD file specification */
    char    *file_spec;                      /* file specification    */
    char    res_string[NAM$C_MAXRSS];        /* resultant string area */
    char    expand_string[NAM$C_MAXRSS];     /* expand string         */
    char    *close_bracket = "]";            /* file spec "terminator" */
    char    *p;                              /* working pointer       */

/* buffer for file information */
    struct {
        char    run_number[8];
        char    dir_type[4];
        short   dir_version;
        char    patient[36];
        } header;
/* calling sequence */
        int rundir(int tdflag)
        {

/* function declarations: */
    long freblk();                           /* returns free blocks   */

/* local data */
    int     rms_status;                      /* rms completion status */
    long    free_blocks;                     /* for freblk() return   */
    char    junk[4];                         /* nonsense for uiasks   */
    short   screen_room = SCREEN_SIZE - LINE_LIMIT; /* remaining room on screen
    int *argp = &tdflag;          /* get pointer to arguments */
    int argc = *(--argp);         /* get number of arguments */

/*---------------------------------------------------------------------*/

/* Initialize RMS blocks, clear the screen, and perform the initial
 * parse of the file specification.
 */
    if (argc != 0 && tdflag)
        file_spec = td_spec;
    else
        file_spec = pd_spec;

rd_initialize();                         /* initialize the RMS stuff */

RCLear (&StdOut);                        /* clear the screen area */
    UITell ("%p1;1H");                       /* home cursor in area   */

UITell ("Run Directory:\\n\\n"); screen_room -= 2; /* title      */ if ((rms_status = sys$parse(&fab)) != RMS$_NORMAL) { /* initial parse */
        UIError (&rms_status);               /* give up if parse fails */
        return (rms_status);
        }
```

```c
/* Search for a file of spec FILESPEC, print its name, open it, read the
 * non-system header, print the patient name field, close the file, and
 * continue.  Loop until $search returns NOT(RMS$_NORMAL) completion -
 * under normal circumstances this will be no_more_files.
 */
    for (;;) {
        if ((rms_status = sys$search(&fab)) != RMS$_NORMAL) /* search files */
            break;                                   /* may be at end of direct. */

*(res_string + nam.nam$b_rsl) = NULL;   /* null terminate string */
        p = strchr(res_string,*close_bracket);
        if (!screen_room) {
            screen_room = SCREEN_SIZE - LINE_LIMIT; /* reset line count */
            UIAsks ("\\n\\n\\n   Type <Carriage Return> to continue..."
                    ,NULL, NULL, &sizeof(junk), junk, &NULL);
            UITell ("%p1;1H");                  /* home cursor           */
            RClear (&StdOut);                   /* clear region          */
        }
        UITell ("\\t%s", ++p);                  /* print file name       */ if ((rms_status = sys$open(&fab)) != RMS$_NORMAL) /* open the file */
            UIError (&rms_status);

if ((rms_status = sys$connect(&rab)) != RMS$_NORMAL) /* connect rab */
            UIError (&rms_status);

if ((rms_status = sys$read(&rab)) != RMS$_NORMAL) { /* read the header */
            UIError (&rms_status);
            UITell ("\\n");
        }
        else UITell ("\\t\\t%s\\n",header.patient);    /* print patient name*/
        screen_room -= 1;

if ((rms_status = sys$close(&fab)) != RMS$_NORMAL) /* close the file */
            UIError (&rms_status);
    }

/* Check RMS return status - if status was no_more_files and some files
 * were found we completed OK. If no files were found say so. If return
 * status was NOT no_more_files issue an error message. Always issue a
 * message stating the number of free blocks.
 */
    if (rms_status == RMS$_NMF) {                /* normal completion?   */
        if (!nam.nam$l_wcc)                      /* yes, any files listed? */
            UITell ("\\n No processed runs found.\\n "); /* no, say so */
    }
    else UIError (&rms_status);                  /* else error           */ free_blocks = freblk();                      /* get device free blocks */
    if (free_blocks >= 0)                        /* if call succeeded     */
        UITell ("\\n\\t\\t%ld free blocks.\\n", &free_blocks); /* print free blo
    else UITell("\\n\\t\\tfree block count unavailable.\\n"); /* freblk failed * if (scrolling_region.menu_mode != CMMDMODE) /* if not in Command Mode, */
        UIAsks ("\\n   Type <Carriage Return> to return to the menu..."
                ,NULL, NULL, &sizeof(junk), junk, &NULL);

return (SS$_NORMAL);
} rd_initialize()
{
```

```
/* Initialize the File Access Block, the Record Access Block, and the
 * Name Block.
 */
    fab = cc$rms_fab;                                   /* initialize FAB           */ fab.fab$l_fna = file_spec;                          /* file spec. string        */
    fab.fab$b_fns = strlen(file_spec);                  /* size of file spec.       */
    fab.fab$l_fop = FAB$M_NAM;                          /* file proc. options       */
    fab.fab$b_fac = FAB$M_GET | FAB$M_BRO;              /* file access options      */
    fab.fab$w_mrs = MAX_REC_SIZE;                       /* maximum record size      */
    fab.fab$b_shr = FAB$M_PUT | FAB$M_UPD |             /* sharing: put; update;    */
                    FAB$M_UPI | FAB$M_MSE |             /* >1 writer; multistream;  */
                    FAB$M_GET;                          /* get.                     */
    fab.fab$l_nam = &nam;                               /* address of name block    */ rab = cc$rms_rab;                                   /* initialize RAB           */ rab.rab$l_bkt = 1;                                  /* virt. block to access    */
    rab.rab$l_ubf = &header;                            /* user record area         */
    rab.rab$w_usz = sizeof(header);                     /* user record area size    */
    rab.rab$b_rac = RAB$C_SEQ;                          /* sequential access        */
    rab.rab$l_fab = &fab;                               /* FAB address              */ nam = cc$rms_nam;                                   /* initialize name block    */ nam.nam$l_rsa = res_string;                         /* resultant string area    */
    nam.nam$b_rss = NAM$C_MAXRSS;                       /* maximum rsa size         */
    nam.nam$l_esa = expand_string;                      /* expand string area       */
    nam.nam$b_ess = NAM$C_MAXRSS;                       /* es area size             */
}
```

What is claimed is:

1. A method of NMR imaging in a single sequence for the formation of a plurality of images of the same selected nuclei, with each image having a different characteristic, said method comprising the steps of:
    (a) eliciting and receiving a first plurality of MRI signals from a plurality of selected nuclei, during a first time interval, said first time interval comprising a plurality of first intervals $T_{R1}$; with each first interval $T_{R1}$ in said first time interval being substantially the same and with said selected nuclei phase encoded by a different magnetic phase encoding gradient, during each of said first intervals;
    (b) continuing to elicit and receive a second plurality of MRI signals from said same plurality of selected nuclei during a second time interval said second time interval comprising a plurality of second intervals $T_{R2}$; interval different from the first intervals $T_{R1}$ and with said selected nuclei phase encoded by a different magnetic phase encoding gradient, during each of said second intervals, with at least some of said magnetic phase encoding gradient during the second time interval same as those during said first time interval; and
    (c) processing said first and second plurality of MRI signals to generate a plurality of images of said selected nuclei, with each image being of the same plurality of selected nuclei, but with differing characteristics.

2. The method of claim 1 wherein said eliciting and receiving step of (a) further comprises:
    changing the phase encoding gradient for each of the first intervals $T_{R1}$, sequentially from a first value to a second value.

3. The method of claim 2 wherein said continuing to elicit and receive step (b) further comprises:
    changing the phase encoding gradient for each of the second intervals $T_{R2}$, sequentially from said first value to said second value.

4. The method of claim 3 wherein said processing step further comprising:
    fourier transforming said first plurality of MRI signals to produce a first magnetic resonance image of said selected nuclei; and
    fourier transforming said second plurality of MRI signals to produce a second magnetic resonance image of said selected nuclei, said second image being of the same plurality of selected nuclei but with differing characteristics.

5. The method of claim 2 wherein said continuing to elicit and receive step (b) further comprises:
    changing the phase encoding gradient for each of the second intervals $T_{R2}$, sequentially for a subset of the values from the first value to the second value.

6. The method of claim 5 wherein said processing step further comprising:
    dividing the first plurality of MRI signals into a plurality of segments;
    combining one or more of said segments of first MRI signals with said second plurality of MRI signals to form a third plurality of MRI signals;
    fourier transforming said first plurality of MRI signals to produce a first magnetic resonance image of said selected nuclei; and fourier transforming said third plurality of MRI signals to produce a second magnetic resonance image of said selected nuclei; said second image being of the same plurality of selected nuclei but with differing characteristics.

7. The method of claim 5 wherein said processing step further comprising:

dividing the first plurality of MRI signals into a plurality of segments; and combining one or more of said segments of said first MRI signals with a conjugate of one of said segments to form a third plurality of MRI signals; and fourier transforming said third plurality of MRI signals to produce a first magnetic resonance image of said selected nuclei.

8. The method of claim 7 wherein said processing step further comprises:

combining one or more of said segments of said first MRI signals with a conjugate of one of said segments and with said second plurality of MRI signals to form a fourth plurality of MRI signals; and fourier transforming said fourth plurality of MRI signals to produce a second magnetic resonance image of said selected nuclei; said second image being of the same plurality of selected nuclei but with differing characteristics.

9. An apparatus for forming a plurality of magnetic resonance images, each having a different characteristic, each of said plurality of images is formed from a plurality of the same selected nuclei, excited in a single sequence; said apparatus comprising:

means for eliciting and receiving a first and a second plurality of MRI signals from the plurality of same selected nuclei in a single sequence, said sequence comprising a first plurality of substantially the same first intervals $T_{R1}$ differing by a phase encoding magnetic gradient; and a second plurality of second intervals $T_{R2}$ differing by a phase encoding magnetic gradient, with at least a portion of said phase encoding magnetic gradient during said second interval same as the gradient during said first intervals, and with said first interval $T_{R1}$ different from said second interval $T_{R2}$; and means for processing said first and second plurality of MRI signals to generate a plurality of images of said selected nuclei, with each image being of the same plurality of selected nuclei but with different characteristics.

10. The apparatus of claim 9 wherein said means for eliciting further comprises:

means for changing the phase encoding gradient for each of the first intervals $T_{R1}$ from a first value to a second values, and for changing the phase encoding gradient for each of the second intervals $T_{R2}$ for a subset of the values from the first value to the second value.

11. The apparatus of claim 10 wherein said means for processing further comprises:

means for dividing the first plurality of MRI signals into a plurality of segments; and means for combining one or more of said segments of first MRI signals with said second plurality of MRI signals to form a third plurality of MRI signals;

means for fourier transforming said first plurality of MRI signals to produce a first magnetic resonance image of said selected nuclei; and means for fourier transforming said third plurality of MRI signals to produce a second magnetic resonance image of said selected nuclei; said second image being of the same plurality of selected nuclei but with differing characteristics.

12. The apparatus of claim 10 wherein said means for processing further comprises:

means for dividing the first plurality of MRI signals into a plurality of segments; and means for combining one or more of said segments of said first MRI signals with a conjugate of one of said segments to form a third plurality of MRI signals; and means for fourier transforming said third plurality of MRI signals to produce a first magnetic resonance image of said selected nuclei.

13. The apparatus of claim 12 wherein said means for processing further comprises:

means for combining one or more of said segments of said first MRI signals with a conjugate of one of said segments and with said second plurality of MRI signals to form a fourth plurality of MRI signals; and means for fourier transforming said fourth plurality of MRI signals to produce a second magnetic resonance image of said selected nuclei; said second image being of the same plurality of selected nuclei but with differing characteristics.

14. A method of NMR imaging in a single sequence for the formation of a plurality of echo images with different characteristics for each slice of selected nuclei, from a plurality of slices of selected nuclei, said method comprising the steps of:

(a) exciting and receiving a first MRI echo signal from each of the plurality of slices, during a first time interval $T_{R1}$, with the magnetic phase encoding gradient maintained the same during the first time interval $T_{R1}$;

(b) repeating step (a) for a plurality of different magnetic phase encoding gradient, to obtain a first plurality of MRI echo signals for each slice of selected nuclei;

(c) continuing to excite and receive a second plurality of MRI echo signals for each slice from the same plurality of slices of selected nuclei as those received from step (a), during a second time interval $T_{R2}$, different from the first time interval $T_{R1}$, with the magnetic phase encoding gradient maintained the same during the first time interval $T_{R2}$;

(d) repeating step (c) for a plurality of different magnetic phase encoding gradient with at least some of said magnetic phase encoding gradient the same as those used in step (b); and (e) processing said first and second plurality of MRI echo signals to generate a plurality of echo images having different characteristics, for each slice of selected nuclei.

15. The method of claim 14 wherein said repeating step of (b) comprises:

changing the magnetic phase encoding gradient sequentially from a first value to a second value.

16. The method of claim 15 wherein said repeating step of (d) comprises:

changing the magnetic phase encoding gradient sequentially from said first value to said second value.

17. The method of claim 16 wherein said processing step further comprising:

fourier transforming said first plurality of MRI echo signals to produce a first magnetic resonance image for each slice of said selected nuclei; and fourier transforming said second plurality of MRI signals to produce a plurality of second magnetic resonance images of each slice of said selected nuclei, said second images being of the same slice as the first image, but with differing characteristics 18. The method of claim 15 wherein said repeating step of (d) comprise:

changing the magnetic phase encoding gradient sequentially for a subset of the values within the range of the first value to the second value.

19. The method of claim 18 wherein said processing step further comprising:

dividing the first plurality of MRI echo signals into a plurality of segments;

combining one or more of said segments of 20 first MRI echo signals with said second plurality of MRI echo signals to form a third plurality of MRI echo signals;

fourier transforming said first plurality of MRI echo signals to produce a first magnetic resonance image for each slice of said selected nuclei; and fourier transforming said third plurality of MRI signals to produce a plurality of second magnetic resonance images for each slice of said selected nuclei; said plurality of second images of each slice being of different characteristics than the first image of the same slice.

20. The method of claim 18 wherein said processing step further comprising:

dividing the first plurality of MRI echo signals into a plurality of segments;

combining one or more of said segments of said first MRI signals with a conjugate of one of said segments to form a third plurality of MRI echo signals; and fourier transforming said third plurality of MRI echo signals to produce a first magnetic resonance image for each slice of said selected nuclei.

21. The method of claim 20 wherein said processing step further comprises:

combining one or more of said segments of said first MRI echo signals with a conjugate of one of said segments and with said second plurality of MRI echo signals to form a fourth plurality of MRI echo signals; and fourier transforming said fourth plurality of MRI echo signals to produce a plurality of second magnetic resonance images for each slice of said selected nuclei; said second images of each slice being of different characteristics than the first image of the same slice.

22. The method of claim 14 wherein each of said first plurality of MRI echo signals is obtained by truncating each of the first plurality of MRI echo signals in the read out direction.

23. The method of claim 22 wherein each of said second plurality of MRI echo signals is obtained by truncating each of the second plurality of MRI echo signals in the read out direction.

24. A method of NMR imaging in a single sequence for the formation of a plurality of images of the same selected nuclei, with each image having a different characteristics, said method comprising the steps of:

(a) eliciting and receiving a first plurality of MRI signals from said selected nuclei;

(b) eliciting and receiving a second plurality of MRI signals from said selected nuclei, said second plurality of MRI signals different from said first plurality;

(c) regrouping and reusing selected portions of said first plurality of MRI signals with said second plurality of MRI signals to form a third plurality of MRI signals; and (d) processing said third plurality of MRI signals to generate the plurality of images of said selected nuclei, with each image being of the same plurality of selected nuclei, but with differing characteristics.

25. A method of NMR imaging in a single sequence for the formation of a plurality of echo images of the same slice of selected nuclei, with each image having a different characteristics, said method comprising the steps of:

(a) exciting and receiving a plurality of MRI echo signals from the slice of selected nuclei, using a magnetic phase encoding gradient value changed from a first value to a second value, repeating at least a portion thereof; and (b) processing the plurality of MRI echo signals to generate a plurality of images of the slice of selected nuclei, with each image having differing characteristics.

26. The method of claim 25 wherein the value of the magnetic phase encoding gradient changed in step (a) is changed sequentially from the first value to the second value.

27. The method of claim 26 wherein the first value of magnetic phase encoding gradient has a first polarity, and the second value of magnetic phase encoding gradient has a second polarity, opposite to that of the first polarity.

28. The method of claim 27 wherein the first MRI echo signal has a peak obtained when the magnetic phase encoding gradient is substantially equal to zero.

29. The method of claim 25 wherein a first plurality of MRI echo signals are obtained using the magnetic phase encoding gradient values changed from the first value to the second value, and a second plurality of MRI echo signals are obtained using at least a portion of the magnetic phase encoding gradient values repeated for the first plurality of MRI echo signals.

30. The method of claim 29 wherein the first MRI echo signals obtained have low frequency components, and high frequency components.

31. The method of claim 30 wherein only one set of first MRI echo signals are obtained for the high frequency components of the magnetic phase encoding gradient.

32. The method of claim 30 wherein the second plurality of MRI echo signals are obtained by repeating only the low frequency components of the magnetic phase encoding gradient.

33. A method of NMR imaging in a single sequence for the formation of a plurality of echo images of the same slice of selected nuclei, with each image having a different characteristics, said method comprising the steps of:

(a) eliciting and receiving a first plurality of MRI echo signals from the slice of selected nuclei;

(b) eliciting and receiving a second plurality of MRI echo signals from the same slice of selected nuclei;

(c) forming a third plurality of MRI echo signals by combining at least portions of said first and second MRI echo signals; and (d) processing the first and third plurality of MRI echo signals to form a plurality of images with different characteristics.

34. A method of time saving in the formation of $T_1$ and $T_2$ weighted images of a slice of selected nuclei, comprising the steps of:
 (a) eliciting and receiving a first plurality of signals from the slice of selected nuclei, from the first echo;
 (b) eliciting and receiving a second plurality of signals from the same slice of selected nuclei, from the second echo;
 (c) forming a third plurality of signals by combining at least portions of said first and second plurality of signals; and
 (d) processing the first and third plurality of signals to form a $T_1$ and a $T_2$ weighted images.

* * * * *